(12) United States Patent
Kim et al.

(10) Patent No.: US 10,923,453 B2
(45) Date of Patent: Feb. 16, 2021

(54) BONDING APPARATUS AND METHOD FOR USING THE SAME

(71) Applicant: Samsung Display Co. Ltd., Yongin-si (KR)

(72) Inventors: Byoung Yong Kim, Seoul (KR); Jeong Ho Hwang, Cheonan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 3 days.

(21) Appl. No.: 16/127,376

(22) Filed: Sep. 11, 2018

(65) Prior Publication Data

US 2019/0198476 A1 Jun. 27, 2019

(30) Foreign Application Priority Data

Dec. 27, 2017 (KR) .................. 10-2017-0180774

(51) Int. Cl.
| | | |
|---|---|---|
| *H01L 27/00* | (2006.01) | |
| *H01L 23/00* | (2006.01) | |
| *G02F 1/13* | (2006.01) | |
| *H01L 27/32* | (2006.01) | |
| *G02F 1/1345* | (2006.01) | |

(52) U.S. Cl.
CPC ............ *H01L 24/81* (2013.01); *G02F 1/1303* (2013.01); *H01L 24/75* (2013.01); *G02F 1/13452* (2013.01); *H01L 24/16* (2013.01); *H01L 27/3244* (2013.01); *H01L 2224/16225* (2013.01); *H01L 2224/7531* (2013.01); *H01L 2224/75343* (2013.01); *H01L 2224/81201* (2013.01); *H01L 2224/81205* (2013.01); *H01L 2224/81815* (2013.01); *H01L 2924/00014* (2013.01); *H01L 2924/14* (2013.01); *H01L 2924/3511* (2013.01)

(58) Field of Classification Search
CPC ..... G02F 1/1303; G02F 1/13452; H01L 24/75
See application file for complete search history.

(56) References Cited

U.S. PATENT DOCUMENTS

| | | | | |
|---|---|---|---|---|
| 6,286,409 B1* | 9/2001 | Na | ........................ | F41F 3/052 89/1.806 |
| 7,454,831 B2* | 11/2008 | Kurosawa | ............... | H01L 24/24 257/773 |
| 7,851,904 B2* | 12/2010 | Kozaka | ............... | G02F 1/13452 257/706 |
| 2006/0103788 A1* | 5/2006 | Kurosawa | ............... | H01L 24/24 349/110 |

(Continued)

FOREIGN PATENT DOCUMENTS

KR       1020140064166 A       5/2014

*Primary Examiner* — Mounir S Amer
*Assistant Examiner* — Alexander Belousov
(74) *Attorney, Agent, or Firm* — Cantor Colburn LLP

(57) ABSTRACT

A bonding apparatus for bonding a driving circuit to a display panel includes: a bonding stage unit on which the display panel is supported in bonding the driving circuit to the display panel; a head unit located above the bonding stage unit and with which ultrasonic waves are applied to the driving circuit to couple the driving circuit with a bonding area of the display panel supported on the bonding stage unit; and a protrusion disposed at an edge portion of the bonding stage unit, the edge portion corresponding to an end of the display panel at which the bonding area is disposed.

10 Claims, 12 Drawing Sheets

(56) References Cited

U.S. PATENT DOCUMENTS

2008/0136017 A1\* 6/2008 Kozaka ............... G02F 1/13452
                                                        257/720
2017/0225196 A1   8/2017 Rothberg et al.
2017/0225273 A1   8/2017 Macdonald et al.
2019/0312020 A1\* 10/2019 Nakamura ............. H01L 24/75

\* cited by examiner

BONDING APPARATUS AND METHOD FOR USING THE SAME

This application claims priority to Korean Patent Application No. 10-2017-0180774 filed on Dec. 27, 2017 and all the benefits accruing therefrom under 35 U.S.C. § 119, the disclosure of which is incorporated herein by reference in its entirety.

BACKGROUND

1. Field

The present disclosure relates to a bonding apparatus and a method for fabricating a display panel using the same.

2. Description of the Related Art

Display devices become more and more important as multimedia technology evolves. Accordingly, a variety of types of display devices such as liquid-crystal display ("LCD") devices and organic light-emitting display ("OLED") devices are currently used.

A display device such as a liquid-crystal display ("LCD") or an organic light-emitting display ("OLED") may include an array substrate including an active area and an inactive area which is disposed outside the active area. The array substrate is used as a circuit substrate for individually driving each pixel in a liquid-crystal display or an organic light-emitting display. On the array substrate, gate lines for transferring scanning signals, data lines for transferring image signals, thin-film transistors, various organic or inorganic insulating films, and the like are disposed. In the inactive area disposed outside the active area, a plurality of lines connected to the gate lines or the data lines in the active area, and a driving circuit for processing signals provided from an external device to generate scan signals and image signals. The driving circuit may be fabricated as a separate integrated circuit chip and mounted on the array substrate.

SUMMARY

Exemplary embodiments of the invention provide a bonding apparatus and a bonding method using the same that allow an electronic component such as an integrated circuit chip to be stably bonded to a substrate such as a display substrate during a process of fabricating a display device.

Exemplary embodiment of the invention also provide a bonding apparatus that can be used in bonding an electronic component such as an integrated circuit chip to a substrate of a flexible display device as well as a relatively rigid display device.

It should be noted that objects of the present disclosure are not limited to the above-mentioned object; and other objects of the invention will be apparent to those skilled in the art from the following descriptions.

An exemplary embodiment of the invention provides a bonding apparatus for bonding a driving circuit to a display panel, the apparatus including: a bonding stage unit on which the display panel is supported in bonding the driving circuit to the display panel; a head unit located above the bonding stage unit and with which ultrasonic waves are applied to the driving circuit to couple the driving circuit with a bonding area of the display panel supported on the bonding stage unit; and a protrusion disposed at an edge portion of the bonding stage unit, the edge portion corresponding to an end of the display panel at which the bonding area is disposed.

An exemplary embodiment of the invention also provides a method for fabricating a display device, the method including: positioning a display panel of the display device on a bonding stage unit of a bonding apparatus; placing a driving circuit of the display device, on a bonding area of the display panel positioned on the bonding stage unit; and mounting the driving circuit to the bonding area of the display panel by applying a pressure and ultrasonic vibration to the driving circuit on the bonding area, by a head unit of the bonding apparatus which is located above the bonding stage unit, where the bonding stage unit includes: a first bonding stage on which is supported the bonding area of the display panel positioned on the bonding stage unit, and a protrusion at an edge portion of the first bonding stage which corresponds to an end of the display panel at which the bonding area is disposed.

According to an exemplary embodiment of the present disclosure, a protrusion is disposed or formed on a stage where a display substrate is disposed for bonding an electronic component thereto, to thereby increase reliability and stability of the bonding.

In addition, a single bonding apparatus can be used in bonding an electronic component such as an integrated circuit chip to a substrate of a flexible display device as well as a relatively rigid display device, so that the efficiency of bonding can be improved.

It should be noted that effects of the present disclosure are not limited to those described above and other effects of the present disclosure will be apparent to those skilled in the art from the following descriptions.

BRIEF DESCRIPTION OF THE DRAWINGS

The above and other features of the present disclosure will become more apparent by describing in detail exemplary embodiments thereof with reference to the attached drawings, in which.

DETAILED DESCRIPTION

Figure 1:
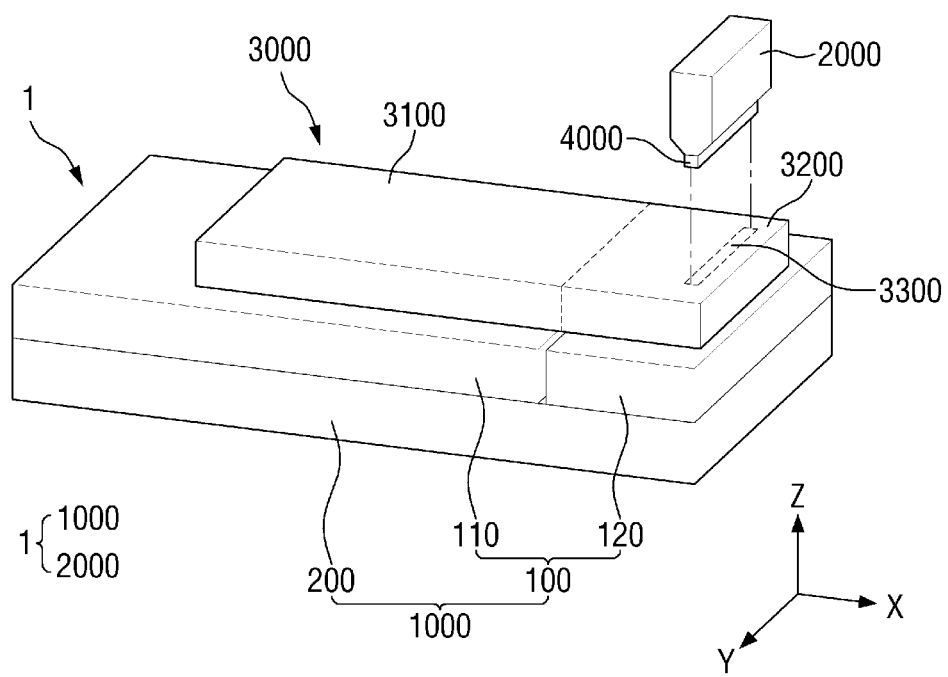
FIG. 1 is a perspective view of an exemplary embodiment of a bonding apparatus according to the invention.

Features of the invention and methods for achieving the same will become apparent with reference to the embodiments described in detail below in conjunction with the accompanying drawings. However, the invention is not limited to the embodiments disclosed below, but may be embodied in various suitable forms. The present embodiments merely make the disclosure of the invention complete and are provided to fully inform the category of the invention to a person having ordinary knowledge in the technical field to which the invention pertains, and the present invention is defined by the scope of the claims, and their equivalents. Like reference numerals refer to like elements throughout.

It will be understood that when an element is referred to as being related to another element such as being "on" another element, it can be directly on the other element or intervening elements may be present therebetween. In contrast, when an element is referred to as being related to another element such as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. As used herein, the singular forms are intended to include plural forms as well, unless the context clearly indicates otherwise. The terms "comprising," "including," and "having" are intended to be inclusive and mean that there may be additional elements other than the listed elements, unless the context clearly indicates otherwise.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the invention are described herein with reference to plan and perspective illustrations that are schematic illustrations of idealized exemplary embodiments of the inventive subject matter. As such, variations from the shapes of the illustrations as a result, for example, of manufacturing techniques and/or tolerances, are to be expected. Therefore, the exemplary embodiments of the present disclosure are not limited to specific features but may include variations depending on the manufacturing processes. Therefore, the regions illustrated in the drawings have schematic attributes, and the shapes of the regions illustrated in the drawings are for illustrating specific shapes and are not for limiting the scope of the present disclosure.

As used herein, a first direction X refers to a direction in a plane, a second direction Y refers to a direction intersecting the first direction X in the plane, and a third direction Z refers to a direction perpendicular to the plane.

Hereinafter, exemplary embodiments of the present disclosure will be described with reference to the accompanying drawings.

Figure 2:
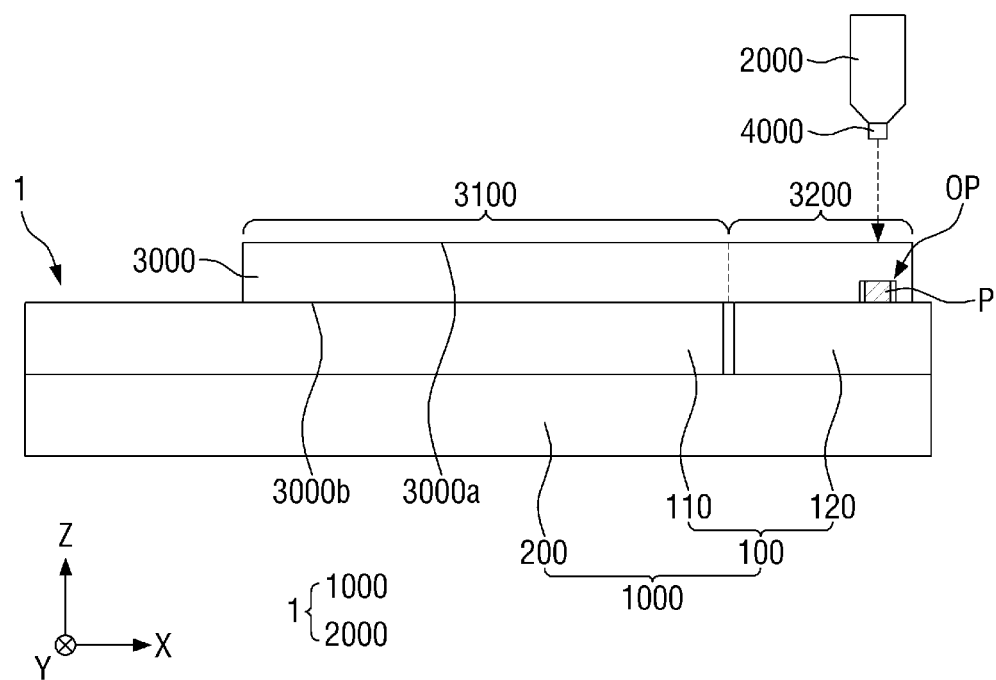
FIG. 2 is a cross-sectional view of the bonding apparatus of FIG. 1, according to the invention.

FIG. 1 is a perspective view of an exemplary embodiment of a bonding apparatus according to the invention. FIG. 2 is a cross-sectional view of the bonding apparatus of FIG. 1, according to the invention.

Referring to FIGS. 1 and 2, a bonding apparatus 1 includes a bonding unit 1000 and a head unit 2000. The bonding apparatus 1 may be used for mounting an electronic component such as a driving circuit 4000 on a display panel 3000 using an ultrasonic bonding method.

The bonding unit 1000 fixes and supports the display panel 3000 during the process of driving the bonding apparatus 1. The bonding unit 1000 may include a bonding stage 100 and a support stage 200. Although the bonding stage 100 and the support stage 200 are shown as separate, individual elements in the drawing, the present disclosure is not limited thereto. In an exemplary embodiment, the bonding stage 100 and the support stage 200 may be formed as a single integrated element. That is, portion of one of the bonding stage 100 and the support stage 200 may extend to define the other one of the bonding stage 100 and the support stage 200.

The head unit 2000 moves the driving circuit 4000 to a predetermined position relative to the display panel 3000 and/or the bonding unit 1000, and bonds the driving circuit 4000 to the display panel 3000. Specifically, the head unit 2000 applies an appropriate pressure and/or ultrasonic vibration to bond a bump 4100 (refer to FIG. 8) of the driving circuit 4000 to a pad (refer to 3000PD of FIG. 8) of the display panel 3000. In some exemplary embodiments, the head unit 2000 may generate the pressure and/or ultrasonic vibration, or the pressure and/or ultrasonic vibration may be generated outside of the head unit 2000 and transferred therethrough. In some exemplary embodiments, the driving circuit 4000 may be a data driver integrated circuit ("IC") that generates and/or provides a data signal for driving the display panel 3000 or the like.

The display panel 3000 is a panel for displaying images in a display device such as an organic light-emitting display device and a liquid-crystal display device. The display panel 3000 may display the image with light generated/emitted within the display panel 3000 or with light provided from a source external thereto. The display panel 3000 may be either a flexible display panel or a relatively rigid display panel. Hereinafter, an example will be described where a flexible display panel is employed as the display panel 3000. An example where a relatively rigid display panel is employed as a display panel 5000 will be described later.

The display panel 3000 includes or defines a first region 3100 including a display area or an active area in which images are displayed, and a second region 3200 as a non-display area or inactive area which is disposed outside the first region 3100 in which the images are not displayed. One or more pixel as a unit for displaying the image may be disposed in the display area. The pixel may be considered a display part of the display panel 3000, or components within the pixel with which the image is displayed may be considered as the display part of the display panel 3000. Components of the display panel 3000 such as electrically conductive gate lines for transferring scanning signals, electrically conductive data lines for transferring image signals, thin-film transistors including various conductive and non-conductive components, various organic or inorganic insulating films, and the like may be disposed within the display panel 3000, such as on a base substrate thereof.

The non-display area which is disposed outside the active area may include conductive signal of lines extending from or connected to the gate lines or the data lines in the display area, and a driving circuit for processing signals provided from an external device to generate various control electronic signals such as the scanning signals and the image signals. A pad part 3000PD is disposed within the second region 3200. In particular, the second region 3200 may further include or define a third region 3300 in which the driving circuit 4000 is disposed. The driving circuit 4000 may be bonded to the display panel 3000 at the third region 3300 thereof such that the third region 3300 may be considering a bonding area of the display panel 3000.

The display panel 3000 includes a first surface 3000a and a second surface 3000b opposed to each other along a thickness direction (e.g., direction Z) of the display panel 3000. The driving circuit 4000 is disposed on the first surface 3000a of the display panel 3000. The bonding area of the display panel 3000 is a portion of the first surface 3000a. The second surface 3000b of the display panel 3000 contacts the bonding stage 100 when the display panel 3000 is disposed in the bonding apparatus 1.

The display panel 3000 may include an opening OP disposed or formed in the third region 3300. The opening OP has a shape of a concave groove that is recessed from the second surface 3000b of the display panel 3000 toward an interior thereof. The opening OP recessed from the second surface 3000b is defined corresponding to the bonding area defined at the first surface 3000a. In some exemplary embodiments, a planar area of the opening OP may be substantially equal to or greater than a planar area of the driving circuit 4000 in the top plan view (e.g., viewing a plane defined by first direction X and second direction Y from the direction Z).

The opening OP of the display panel 3000 allows the display panel 3000 to be bonded to the driving circuit 4000 more reliably. In some exemplary embodiments, the display panel 3000 may include a display substrate in which circuits such as thin film transistors ("TFTs") are disposed on a base substrate of the display panel 3000, and a support member disposed under the display substrate to support the display substrate thereon. Since the support member absorbs the vibration of the ultrasonic wave during the ultrasonic bonding process, the display panel 3000 may not be bonded to the driving circuit 4000. However, by removing the support member from the display panel 3000 and instead forming the opening OP in the display panel 3000, the vibration of the ultrasound wave applied by the head unit 2000 is not absorbed and can be fully transferred to components of the display panel 3000. Accordingly, the reliability of bonding between the display panel 3000 and the driving circuit 4000 can be increased.

Hereinafter, the bonding apparatus 1 will be described with reference to FIGS. 3 and 4.

Figure 3:
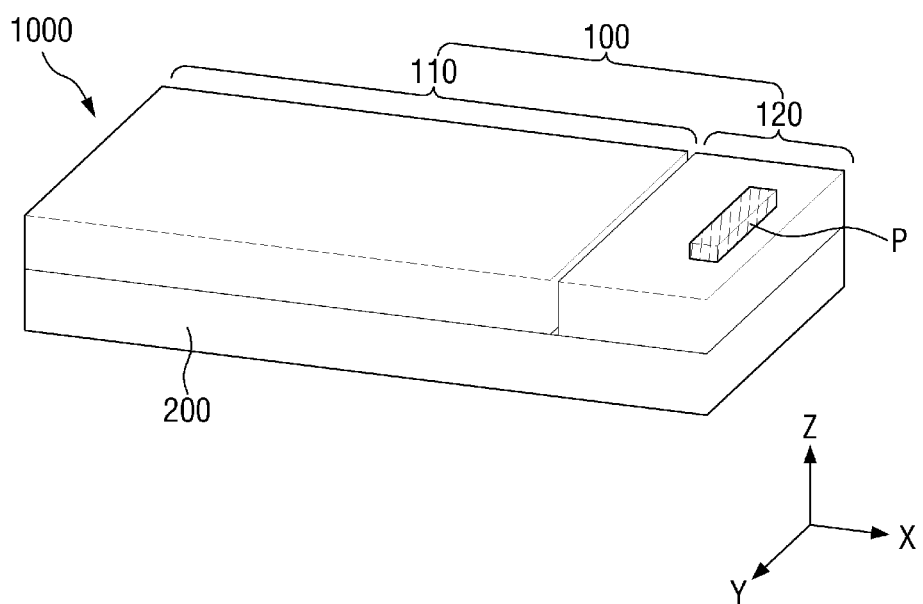
FIG. 3 is a perspective view of an exemplary embodiment of a bonding unit of a bonding apparatus, according to the invention.

FIG. 3 is a perspective view of an exemplary embodiment of a bonding unit of a bonding apparatus, according to the invention. FIG. 4 is a top plan view of the bonding unit of a bonding apparatus of FIG. 3, according to the invention. In FIG. 4, the positions where the display panel 3000 and the driving circuit 4000 would be disposed are depicted by dashed lines, respectively, for the sake of understanding.

Figure 4:
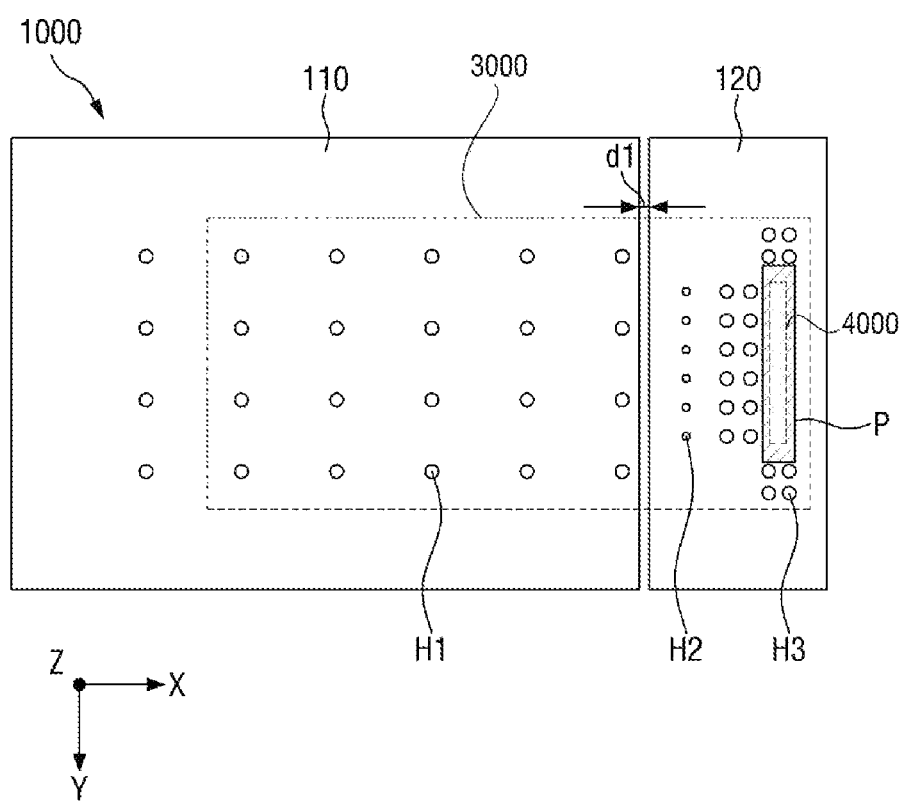
FIG. 4 is a top plan view of the bonding unit of a bonding apparatus of FIG. 3, according to the invention.

Referring to FIGS. 3 and 4, the bonding stage 100 supports a structure of the display panel 3000, such as the display substrate having components thereof on the base substrate, during the process of driving the bonding apparatus 1. The bonding stage 100 may have a flat plate shape and can stably support the display panel 3000 thereon. The bonding stage 100 may include or be formed of a relatively rigid material. In an exemplary embodiment, for example, the bonding stage 100 may include a stainless steel material. As the bonding stage 100 has a certain rigidity, the display substrate of the display panel 3000 may be supported on the bonding stage 100 more stably.

The bonding stage 100 may include a first bonding stage (portion) 110 and a second bonding stage (portion) 120 which are independent of each other. A total planar area of the first bonding stage 110 may be larger than that of the second bonding stage 120 in the top plan view. The first bonding stage 110 may have an overall rectangular shape having relatively longer sides lengthwise extended in a first direction X and relatively shorter sides lengthwise extended in a second direction Y in the top plan view. The second bonding stage 120 may have an overall rectangular shape having relatively shorter sides lengthwise extended in the first direction X and relatively longer sides lengthwise extended in the second direction Y. It is to be noted that the present disclosure is not limited thereto. The size and shape of the first and second bonding stages 110 and 120 may vary depending on the shape of the display panel 3000 to be bonded with the driving circuit 4000. The support stage 200 may be common to each of the first and second bonding stages 110 and 120.

The first bonding stage 110 and the second bonding stage 120 can independently support the first region 3100 and the second region 3200 of the display panel 3000, respectively. Specifically, the first bonding stage 110 may generally support the first region 3100 of the display panel 3000, and the second bonding stage 120 may generally support the second region 3200 of the display panel 3000. It is, however, to be understood that the present disclosure is not limited thereto. In some exemplary embodiments, the first bonding stage 110 may support the first region 3100 and a portion of the second region 3200 of the display panel 3000 as well.

The second bonding stage 120 may include a heat source which generates and provides heat. In an exemplary embodiment, for example, the second bonding stage 120 may be a heating plate having a heater therein. The second bonding stage 120 can heat the corresponding region of the display panel 3000, e.g., the second region 3200, and especially the third region 3300 of the display panel 3000 to facilitate the bonding of the driving circuit 4000 to the display panel 3000.

Specifically, in order to bond the pad of the display panel 3000 to the bump 4100 of the driving circuit 4000, the contact surfaces between the pad of the display panel 3000 and the bump 4100 of the driving circuit 4000 (hereinafter referred to as contact surfaces) are heated up to a predetermined temperature (e.g., the melting point of the pad of the display panel 3000 and/or of the bump 4100 of the driving circuit 4000). By applying an appropriate pressure and ultrasonic vibration to the driving circuit 4000 by the head unit 2000, frictional heat is generated at the contact surfaces so that the temperature can be increased up to the predetermined temperature for the bonding.

As the second bonding stage 120 heats the third region 3300 of the display panel 3000, the temperature of the contact surfaces can be easily increased up to the predetermined temperature even with a smaller pressure and/or ultrasonic vibration by the head unit 2000. If the pressure and/or the ultrasonic vibration applied to the driving circuit 4000 is too strong, the driving circuit 4000 and/or the pad part 3200 of the display panel 3000 may be damaged. By heating the third region 3300 of the display panel 3000 with the second bonding stage 120, the pressure and/or the ultrasonic vibration applied to the driving circuit 4000 can be reduced, to thereby reduce or effectively prevent the driving circuit 4000 from being damaged.

The first bonding stage 110 and the second bonding stage 120 are spaced apart from each other along the first direction X to reduce or effectively prevent the heat of the second bonding stage 120 from being transferred to the first bonding stage 110. The distance dl between the first bonding stage 110 and the second bonding stage 120 may range from approximately 0.5 millimeter (mm) to 5 millimeters (mm). In an exemplary embodiment, for example, the distance dl between the first bonding stage 110 and the second bonding stage 120 may be approximately 1 mm.

The second bonding stage 120 includes a flat portion 120F (refer to FIG. 8) and a protrusion P protruding from the flat portion 120F in a third direction Z. The protrusion P overlaps with the opening OP of the display panel 3000 during the ultrasonic bonding process and supports the third region 3300 of the display panel 3000, to increase bonding reliability between the display panel 3000 and the driving circuit 4000.

More specifically, the display panel 3000 according to the exemplary embodiment of the present disclosure is a flexible display device which is bent when an external force is applied thereto, and may be relatively easily bent when a pressure is applied by the head unit 2000. In particular, if the protrusion P is not disposed or formed on the second bonding stage 120, the display panel 3000 at the opening OP thereof is not supported, such that the display panel 3000 may be bent more easily at the second region 3200. As a result, the driving circuit 4000 may fail to be bonded to the display panel 3000. In contrast, according to one or more exemplary embodiment of the invention, if the second bonding stage 120 includes the protrusion P corresponding to the third region 3300 of the display panel 3000, the opening OP of the display panel 3000 is supported stably, such that the display panel 3000 may not be bent. As a result, the driving circuit 4000 may be bonded to the display panel 3000 stably.

The protrusion P may be disposed or formed integrally with the flat portion 120F or may be formed as a separate member coupled with the flat portion 120F. The protrusion P may be the same material as the flat portion 120F or may include or be made of a different material. In an exemplary embodiment, for example, the protrusion P may include be made of a material having a relatively higher rigidity than the flat portion 120F.

The protrusion P may be disposed adjacent to one side or outer edge of the second bonding stage 120. In an exemplary embodiment, for example, the protrusion P may be disposed adjacent to one of the relatively longer sides of the second bonding stage 120 that is furthest from the first bonding stage 110.

The protrusion P may have an overall box shape lengthwise extended along one side of the second bonding stage 120. In other words, the protrusion P may have a rectangular shape including the relatively shorter sides extended in the first direction X and the relatively longer sides extended in the second direction Y in the top plan view, similar to the longer and shorter sides of the second bonding stage 120. It is, however, to be understood that the shape of the protrusion P is not limited thereto.

The size of the protrusion P may be equal to the size of the opening OP of the display panel 3000 in the top plan view. In an exemplary embodiment, for example, the total planar area of the protrusion P along the XY plane, may be substantially equal to or less than the total planar area of the opening OP of the display panel 3000 along the XY plane in the top plan view.

The height of the protrusion P along the thickness direction of the bonding unit 1000 (e.g., the third direction Z) may be equal to the height of the opening OP of the display panel 3000 in the same direction. In an exemplary embodiment, for example, the height of the protrusion P may be substantially equal to or less than a total height of the display panel 3000. In some exemplary embodiments, the height of the protrusion P may be substantially equal to the height of a protective member (not shown) for protecting the display substrate of the display panel 300.

Each of the first bonding stage 110 and the second bonding stage 120 may include a plurality of suction holes. The suction holes are vacuum holes for applying suction to the display panel 3000 thereon and stably fixing the display panel 3000 on the stage.

The plurality of suction holes may include first to third suction holes H1, H2 and H3. Specifically, the plurality of suction holes may include one or more of a first suction hole H1 defined or formed in the first bonding stage 110, one or more of a third suction hole H3 defined or formed in the second bonding stage 120 around the protrusion P, and one or more of a second suction hole H2 defined or formed in the second bonding stage 120 between the first suction hole H1 and the second suction hole H2. It is, however, to be understood that the number and arrangement of the suction holes are not limited thereto. In an exemplary embodiment, for example, there may be only one or two suction holes or more than four suction holes.

A plurality of the first suction holes H1 may be arranged in a matrix along the first direction X and the second direction Y. The first suction holes H1 may be arranged at a regular spacing in the first direction X and the second direction Y. In an exemplary embodiment, for example, the first suction holes H1 may be arranged at the spacing of approximately 10 mm in the first direction X and the second direction Y. Such spacings may represent minimal distances between first suction holes H1.

A plurality of the second suction holes H2 may be arranged in parallel with the relatively longer sides of the protrusion P. In other words, a column of the second suction holes H2 may be arranged in the second direction Y. It is, however, to be understood that the present disclosure is not limited thereto. The second suction holes H2 may be arranged in a plurality of columns each lengthwise in the second direction Y. The columns may be arranged in the first direction X. In an exemplary embodiment, the spacing between the second suction holes H2 along the first and/or second directions X and Y may be approximately 5 mm. Such spacings may represent minimal distances between second suction holes H2.

The third suction holes H3 may be arranged around the protrusion P so as to not overlap the protrusion P. Specifically, the third suction holes H3 may be arranged along both the relatively shorter sides and one or more of the relatively longer sides of the protrusion P. In an exemplary embodiment, the spacing between the third suction holes H3 and the second suction holes H2 may be approximately 10 mm. The spacing between the third suction holes H3 and the protrusion P may be approximately 2 mm. In addition, the third suction holes H3 arranged adjacent to the relatively longer side of the protrusion P may be arranged at the spacing of approximately 7 mm along the second direction Y, and the third suction holes H3 arranged adjacent to the relatively shorter side of the protrusion P may be arranged at the spacing of the approximately 2 mm. Such spacings may represent minimal distances between third suction holes H3 and between a third suction hole H3 and the protrusion, respectively.

The first to third suction holes H1, H2 and H3 may have different planar sizes from each other. In an exemplary embodiment, for example, the size of the first suction holes H1 formed in the first bonding stage 110 may be larger than the sizes of the second and third suction holes H2 and H3 formed in the second bonding stage 120. The size of the second suction holes H2, which are arranged relatively close to the first bonding stage 110 with respect to the third suction holes H3, may be smaller than the size of the third suction holes H3. In an exemplary embodiment, for example, the diameter of each of the first suction holes H1 may be approximately 2 mm, the diameter of each of the second suction holes H2 may be approximately 0.2 mm, and the diameter of each of the third suction holes H3 may be approximately 1 mm. A minimum size of the first suction holes H1 may be larger than a maximum size of each of the second and third suction holes H3 and H3, and a minimum size of the third suction holes H3 may be larger than a maximum size of the second suction holes H2, without being limited thereto.

The first to third suction holes H1 to H3 may be connected to a connection passage (not shown) passing through a thickness of the first bonding stage 110 and the second bonding stage 120, respectively. The first to third suction holes H1, H2 and H3 may be connected to a single connection passage so as to be controlled together. It is, however, to be understood that the present disclosure is not limited thereto. The first suction holes H1 in the first bonding stage 110 and the second and third suction holes H2 and H3 formed in the second bonding stage 120 may be connected to different connection passages to be controlled separately.

Hereinafter, other exemplary embodiments of the present disclosure will be described. In the following description, the same or similar elements will be denoted by the same or similar reference numerals, and redundant descriptions will be omitted or briefly described. Descriptions will be made focusing on differences from the above exemplary embodiment.

Figure 5:
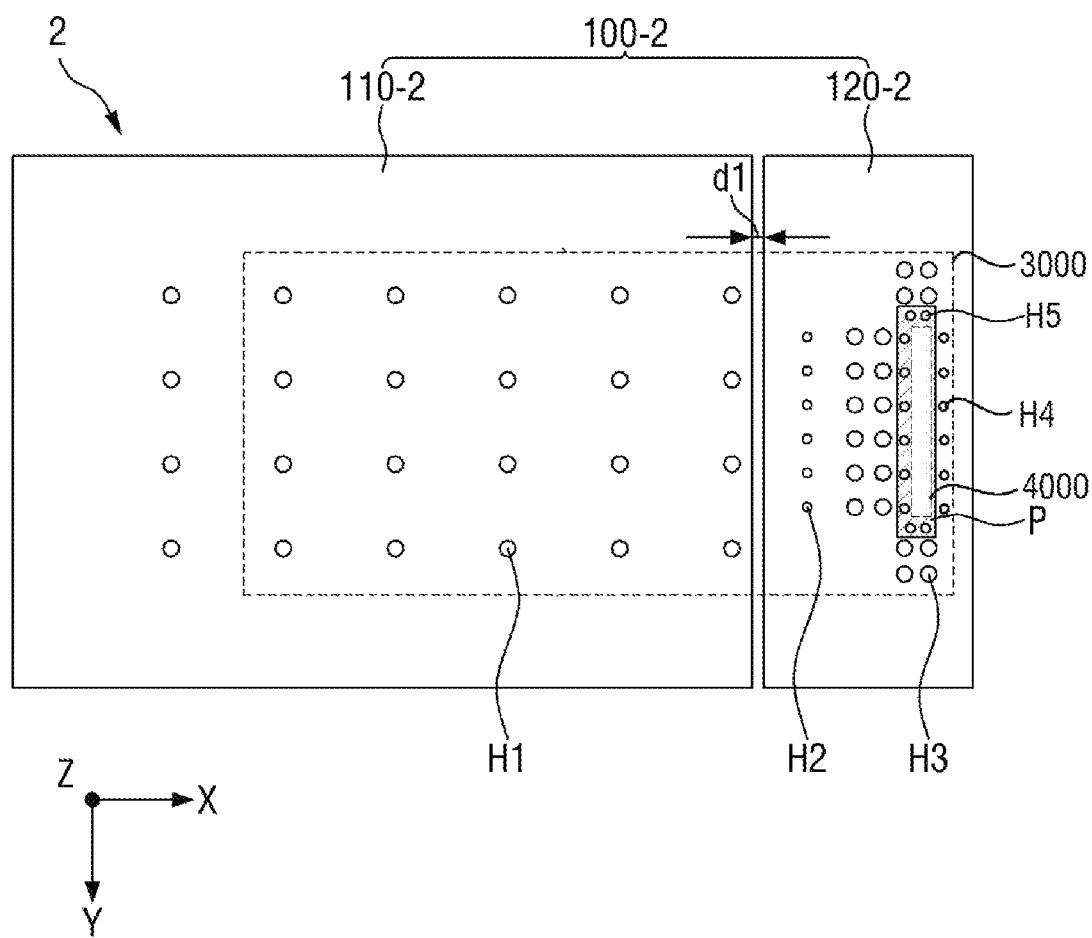
FIG. 5 is a top plan view of another exemplary embodiment of a bonding unit of a bonding apparatus, according to the invention.

FIG. 5 is a top plan view of another exemplary embodiment of a bonding unit of a bonding apparatus, according to the invention. In FIG. 5, the positions where the display panel 3000 and the driving circuit 4000 are to be disposed are depicted by dashed lines, respectively, for the sake of understanding.

Referring to FIG. 5, a bonding stage 100-2 of the bonding apparatus 2 may further include fourth suction holes H4 and fifth suction holes H5 in addition to first to third suction holes H1, H2 and H3 described above.

The first suction hole H1 may be arranged in the first bonding stage 110-2, and the second to fifth suction holes H2, H3, H4 and H5 may be arranged in the second bonding stage 120-2. The fourth and fifth suction hole H4 and H5 may each be provided in plurality in the second bonding stage 120-2.

The fourth suction holes H4 may be arranged along one of the relatively longer side of the protrusion P while third suction holes H3 are arranged along the other one of the relatively longer sides thereof. The fourth suction holes H4 may be further from the first bonding stage 110-2 than the third suction holes H3, and may be arranged closer to an outer edge of the overall bonding stage 100-2 than the third suction holes H3.

The fifth suction holes H5 may be formed in the protrusion P. The fifth suction holes H5 may be arranged in the protrusion P, except an area of the protrusion P where the driving circuit 4000 is to be disposed. If the fifth suction holes H5 are formed in the area of the protrusion P where the driving circuit 4000 is disposed, the display panel 3000 may not be stably supported during the ultrasonic bonding process, so that the driving circuit 4000 may not reliably bonded to the display panel 3000.

The fourth suction holes H4 and the fifth suction holes H5 may have the same planar size as each other. In an exemplary embodiment, for example, the diameters of the fourth suction holes H4 and the fifth suction holes H5 may be approximately 0.2 mm. The sizes of the fourth and fifth suction holes H4 and H5 may be smaller than the sizes of the first and third suction holes H1 and H3. It is, however, to be understood that the present disclosure is not limited thereto. The sizes of the fourth and fifth suction holes H4 and H5 may be adjusted depending on the size of the display panel 3000 and the size of the protrusion P.

Hereinafter, a method for fabricating a display panel including mounting a driving circuit on a flexible display panel using a bonding apparatus according to an exemplary embodiment of the present disclosure will be described in detail.

Figure 6:
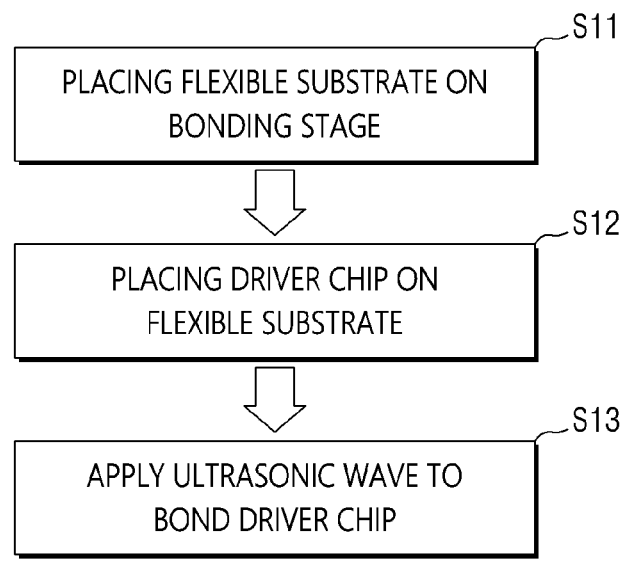
FIG. 6 is a flowchart illustrating an exemplary embodiment of a method for fabricating a display panel by using a bonding apparatus, according to the invention.
Figure 7:
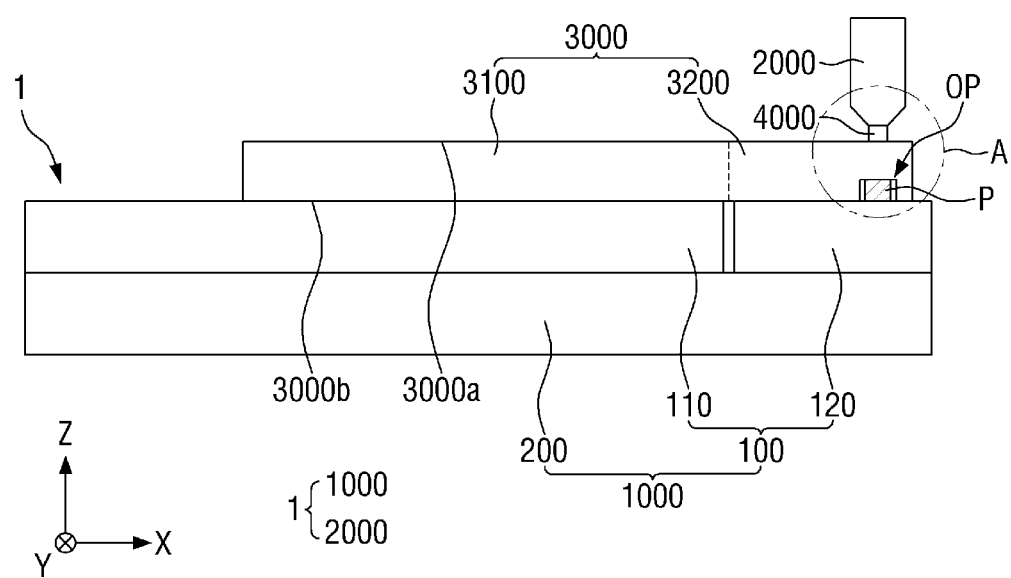
FIG. 7 is a cross-sectional view illustrating an exemplary embodiment of a process within the method for fabricating a display panel of FIG. 6, according to the invention.
Figure 8:
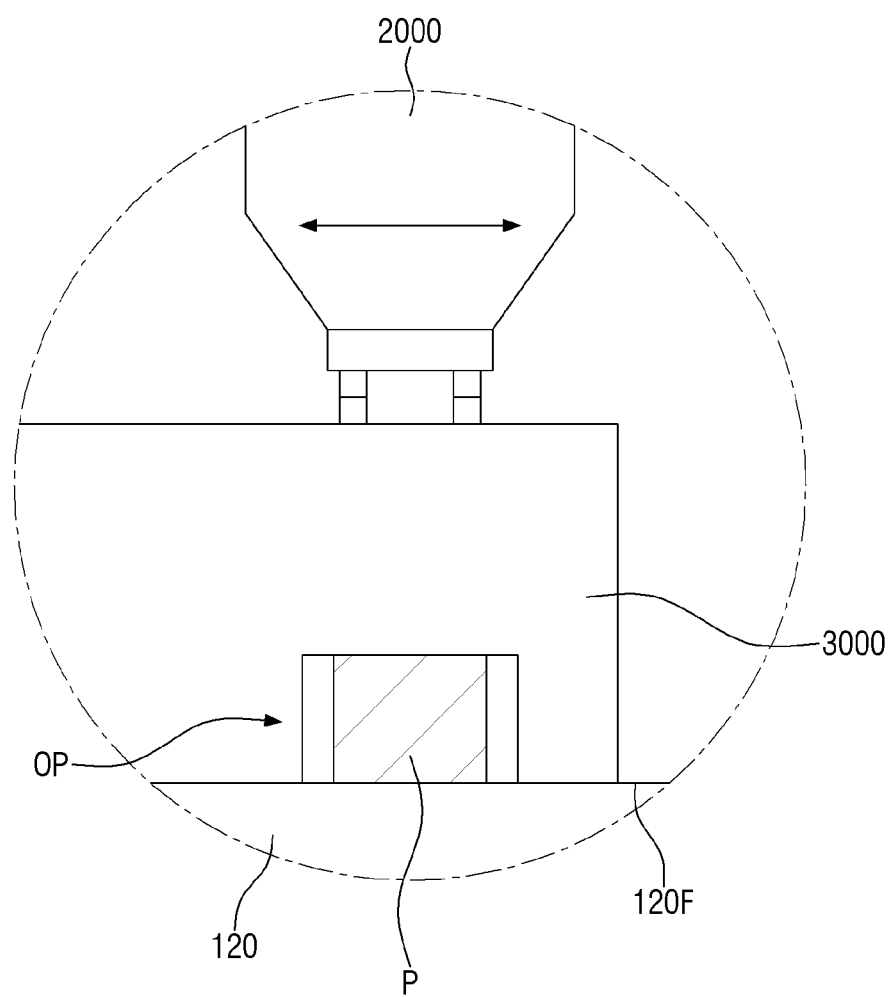
FIG. 8 is an enlarged cross-sectional view of area A of FIG. 7.

FIG. 6 is a flowchart illustrating an exemplary embodiment of a method for fabricating a display panel by using a bonding apparatus, according to the invention. FIG. 7 is a cross-sectional view illustrating an exemplary embodiment of a process within the method for fabricating a display panel of FIG. 6, according to the invention. FIG. 8 is an enlarged cross-sectional view of area A of FIG. 7.

It is to be understood that the bonding apparatus 1 of FIGS. 1 to 4 as well as the bonding apparatus 2 of FIG. 5 may be employed as the bonding apparatus used in the method of FIGS. 6 to 8.

Referring to FIGS. 1, 6, 7 and 8, a display panel 3000 is placed on the bonding unit 1000 of the bonding apparatus 1, specifically on each of the first bonding stage 110 and the second bonding stage 120, as shown in FIG. 1 (operation S11). As mentioned earlier, the first region 3100 of the display panel 3000 may generally overlap the first bonding stage 110, and the second region 3200 of the display panel 3000 may generally overlap the second bonding stage 120. In particular, the opening OP of the display panel 3000 overlaps the protrusion P of the second bonding stage 120 as described above.

As shown in FIGS. 7 and 8, the head unit 2000 is moved relative to the display panel 3000 disposed on the bonding stages, to place the driving circuit 4000 above the third region 3300 of the display panel 3000 (operation S12). The driving circuit 4000 may be moved together with the head unit 2000 (refer also to FIG. 1). Specifically, the pad portion 3000PD of the display panel 3000 and the bump 4100 of the driving circuit 4000 are brought into contact with each other by movement of the head unit 2000 having the driving circuit 4000 attached thereto, relative to the display panel 3000 disposed on the bonding stages. The pad part 3000PD may include a terminal through which a driving signal is output to the display panel 3000 for driving a display part of the display panel 3000, and a terminal through which a control signal and/or a power from external devices are received by the display panel 3000. In some exemplary embodiments, a plurality of terminals may be disposed in the second direction Y at the third region 3300 of the display panel 3000.

A pressure is applied to the driving circuit 4000 in contact with the pad portion 3000PD of the display panel 3000, by application of a force from the head unit 2000, and simultaneously with the application of the pressure, the head unit 2000 is vibrated to apply ultrasonic vibration (generally indicated by the double-headed arrow in FIG. 8) to a driver chip 4200 of the driving circuit 4000 in contact with the pad portion 3000PD (operation S13). The bump 4100 of the driving circuit 4000 and the pad part 3000PD of the display panel 3000 are bonded to each other by the pressure and the ultrasonic vibration applied to the driver chip 4200.

During the bonding of the bump 4100 of the driving circuit 4000 and the pad part 3000PD of the display panel 3000 to each other by the pressure and the ultrasonic vibration applied to the driver chip 4200 by the head unit 2000, the protrusion P of the second bonding stage 120 is disposed with the opening OP of the display panel 3000. As described above, by forming the opening OP in the display panel 3000, the amount of the absorbed ultrasonic vibration can be reduced to maximize the amount of the ultrasonic vibration to the driving circuit 4000, and the display panel 3000 at the opening OP thereof is supported by the protrusion P extended into the opening OP from an upper surface of the second bonding stage 120 so that bending or warping of the display panel 3000 under pressure from the head unit 2000 is reduced or effectively prevented. Accordingly, the driving circuit 4000 can be stably mounted on the display panel 3000 through the ultrasonic bonding method.

Although not shown in the drawings, the method may further include disposing a reinforcing member in the opening OP open at the second surface 3000b of the display panel 3000 after the driving circuit 4000 is mounted at the first surface 3000a of the display panel 3000. By disposing the reinforcing member in the opening OP, the strength and/or rigidity of the portion of the display panel 3000 exposed at the opening OP can be increased.

The reinforcing member disposed in the opening OP of the display panel 3000 may include or be made of a material having a relatively high hardness. In an exemplary embodiment, the reinforcing member may including or be made of a material having hardness greater than the hardness of the support member within the display panel 3000 supporting the display substrate thereof.

Hereinafter, a method for fabricating a display panel in which a driving circuit 4000 is mounted on a relatively rigid display panel using a bonding apparatus according to another exemplary embodiment of the present disclosure will be described in detail.

Figure 9:
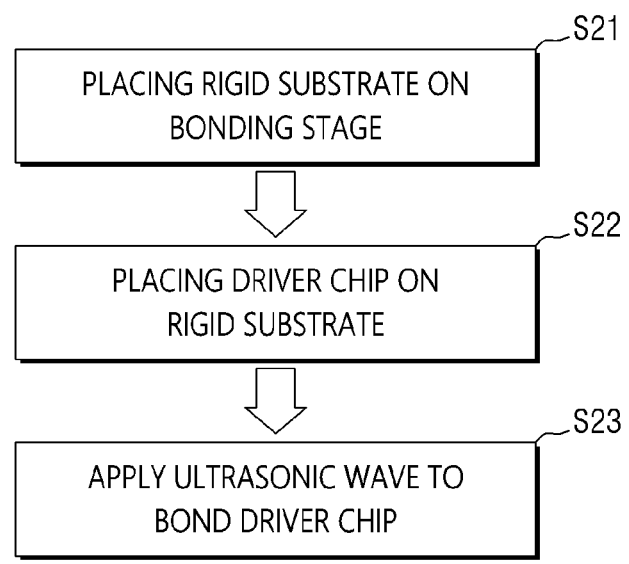
FIG. 9 is a flowchart illustrating another exemplary embodiment of a method for fabricating a display panel by using a bonding apparatus, according to the invention.
Figure 10:
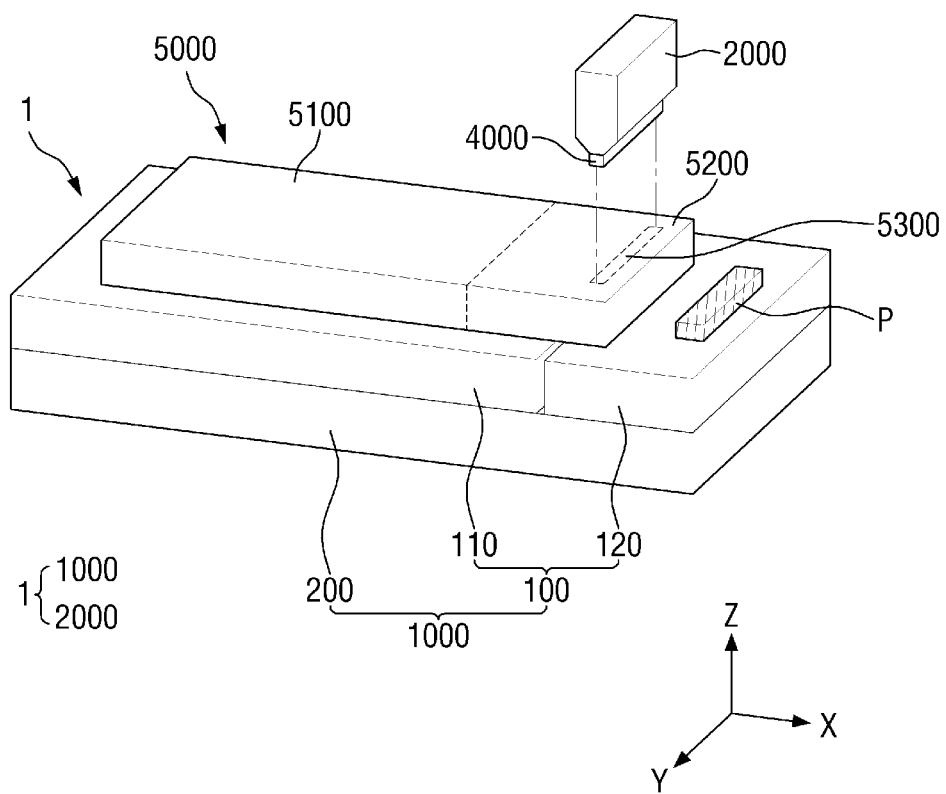
FIGS. 10 and 11 are cross-sectional views illustrating processes within the method for fabricating a display panel of FIG. 9, according to the invention.
Figure 11:
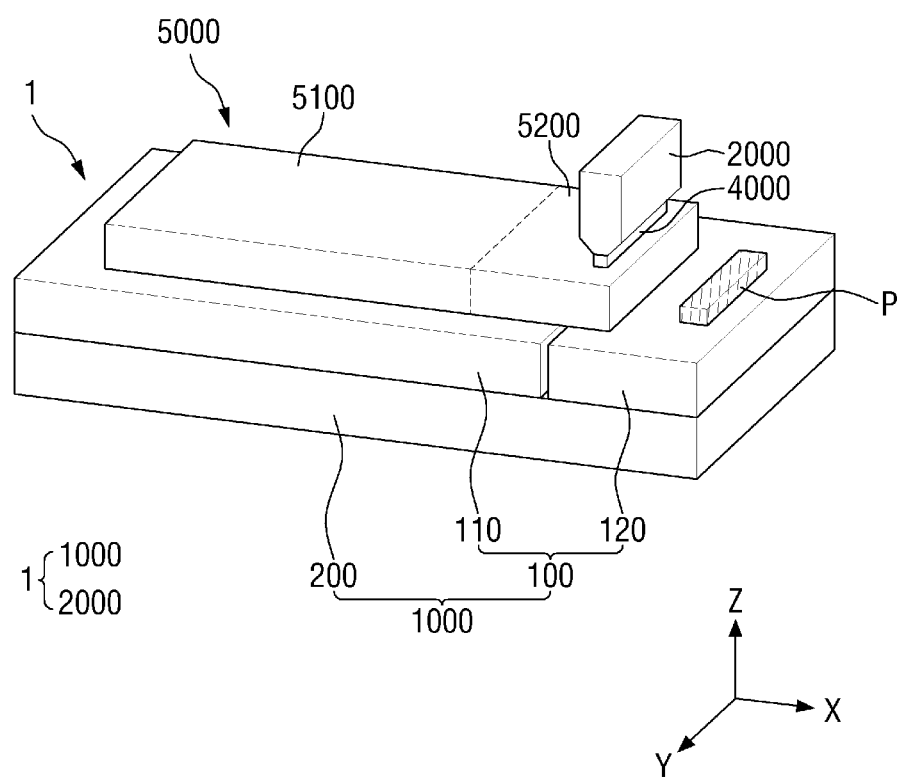
Figure 12:
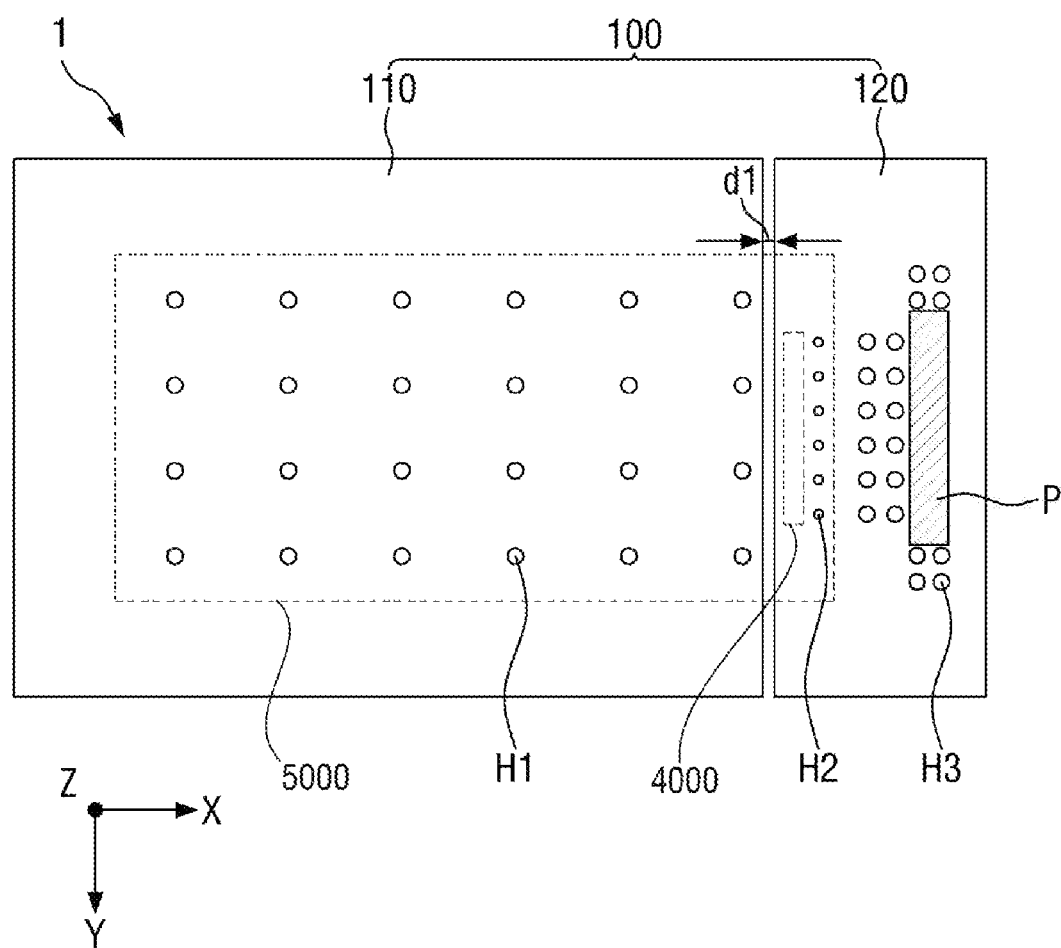
FIG. 12 is a top plan view showing the operation of FIG. 11.

FIG. 9 is a flowchart illustrating another exemplary embodiment of a method for fabricating a display panel by using a bonding apparatus, according to the invention. FIGS. 10 and 11 are cross-sectional views illustrating processes in the method for fabricating a display panel of FIG. 9, according to the invention. FIG. 12 is a top plan view showing the operation of FIG. 11.

It is to be understood that the bonding apparatus 1 of FIGS. 1 to 4 as well as the bonding apparatus 2 of FIG. 5 may be employed as the bonding apparatus used in the method for fabricating a display panel 5000 of FIGS. 9 to 12.

Referring to FIGS. 9 to 12, the display panel 5000 may be a relatively rigid display panel that is not easily bent even when an external force is applied thereto, as compared to the flexible display panel discussed above relative to FIGS. 6 to 8. For example, the display panel 5000 may include a glass substrate or the like. If the display panel 5000 includes a substrate that maintains a shape thereof such as a glass substrate, an additional support member is not used, unlike the flexible display panel 3000 which includes support member disposed under the display substrate of the flexible display panel 3000. Accordingly, removal of such an additional support member is obviated, and thus the display panel 5000 according to the exemplary embodiment of the present disclosure may not include the opening OP. It is, however, to be understood that the present disclosure is not limited thereto. The display panel 5000 may include an opening OP, in which case, the driving circuit 4000 may be mounted on the display panel 5000 in the same manner as in FIGS. 6 to 8.

The display panel 5000 includes a first region 5100 including an active area, and a second region 5200 including an inactive area at which a (terminal) pad is disposed. In particular, the second region 5200 may further include a third region 3300 where the driving circuit 4000 is disposed.

Initially, the display panel 5000 is placed on the bonding unit 1000 as shown in FIG. 10 (operation S21). Unlike the display panel 3000 of FIGS. 1 to 8, according to the exemplary embodiment in FIGS. 9 to 12, a portion of the second region 5200 of the display panel 5000 as well as the first region 5100 thereof may each be placed on the first bonding stage 110. It is to be noted that an entirety of the third region 5300 within the second region 5200 and at which the driving circuit 4000 is mounted may be disposed on the second bonding stage 120. As described above, the second bonding stage 120 includes a heat source to heat the third region 5300 of the display panel 5000, so that the driving circuit 4000 can be bonded to the display panel 5000 with a relatively smaller pressure and/or ultrasonic vibration.

The third region 5300 of the display panel 5000 does not overlap with the second suction holes H2 defined in the second bonding stage 120. The third region 5300 of the display panel 5000 (indicated by the dotted line for the driving circuit 4000 in FIG. 12) is disposed on the second bonding stage 120 and extends onto the flat portion 120F of the second bonding stage 120 between a relatively longer side of the second bonding stage 120 which is closest to the first bonding stage 110, and the second suction holes H2. A pressure applied to the driving circuit 4000 may be reduced by the second suction holes H2. When this happens, the driving circuit 4000 may fail to be bonded to the display panel 5000. Accordingly, in one or more exemplary embodiment, the third region 5300 of the display panel is disposed on the flat portion 120F of the second bonding stage 120 which excludes the second suction holes H2 to reduce or effectively prevent the loss of pressure applied to the driving circuit 4000. By doing so, it is possible to bond the driving circuit 4000 to the display panel 4000 stably.

The head unit 2000 is moved so that the driving circuit 4000 overlaps with the third region 5300 of the display panel 5000 (operation S22). Then, a pressure is applied to the driving circuit 4000 while ultrasonic vibration is applied to the driving circuit 4000 by vibrating the head unit 2000 (operation S23). By the pressure and the ultrasonic vibration applied to the driving circuit 4000 by the head unit 200, the bump 4100 of the driving circuit 4000 and the pad part 3000PD of the display panel 5000 are bonded to each other.

Although certain exemplary embodiments and implementations have been described herein, other embodiments and modifications will be apparent from this description. Accordingly, the invention are not limited to such embodiments, but rather to the broader scope of the appended claims and various obvious modifications and equivalent arrangements as would be apparent to a person of ordinary skill in the art.

What is claimed is:

1. A bonding apparatus for bonding a driving circuit to a display panel, the apparatus comprising:
    a bonding stage unit on which the display panel is supported in bonding the driving circuit to the display panel;
    a head unit located above the bonding stage unit and with which ultrasonic waves are applied to the driving circuit to couple the driving circuit with a bonding area of the display panel supported on the bonding stage unit; and
    a protrusion protruding from the bonding stage unit,
    wherein location of the head unit above the bonding stage unit disposes,
        the driving circuit overlapping the protrusion, and
        the bonding area of the display panel supported on the bonding stage unit between the driving circuit and the protrusion overlapped thereby.

2. The apparatus of claim 1, wherein
    the display panel comprises:
        a first surface including the bonding area,
        a second surface which opposes the first surface, and corresponding to the bonding area of the first surface, an opening recessed from the second surface,
    support by the bonding stage unit of the display panel disposes the protrusion in the opening of the display panel, and
    the location of the head unit above the bonding stage unit further disposes the bonding area of the first surface between the driving circuit and the protrusion disposed in the opening of the display panel.

3. The apparatus of claim 1, wherein a planar size of the protrusion is equal to or greater than a planar size of the driving circuit.

4. The apparatus of claim 1, wherein
    the bonding stage unit comprises:
        a first bonding stage portion corresponding to an active display region of the display panel supported on the bonding stage unit, and
        a second bonding stage portion corresponding to an inactive display region of the display panel supported on the bonding stage unit, the bonding area of the display panel disposed in the inactive display region thereof,
    the second bonding stage portion is spaced apart from the first bonding stage portion, and
    the protrusion is disposed at an edge portion of the second bonding stage portion which is furthest from the first bonding stage portion.

5. The apparatus of claim 4, wherein
    the first and second bonding stage portions are separated from each other along a first direction, and
    the protrusion has a box shape lengthwise extended in a second direction crossing the first direction.

6. The apparatus of claim 4, wherein the second bonding stage portion includes a heater with which the bonding area in the inactive display region of the display panel supported on the bonding stage unit is heated in the bonding of the driving circuit to the display panel.

7. The apparatus of claim 6, wherein the inactive display region of the display panel comprises:
    a first region directly extended from the active display region of the display panel, and
    as the bonding area to which the driving circuit is coupled, a second region within the first region, the second region having a planar area corresponding to a planar area of the driving circuit,
    wherein for the display panel supported on the bonding stage unit, the second region of the inactive display region is disposed on the second bonding stage portion of the bonding stage unit.

8. The apparatus of claim 1, wherein the bonding stage unit further comprises outside the bonding area of the display panel supported on the bonding stage unit, a first suction hole with which the display panel supported on the bonding stage unit is fixed to the bonding stage unit.

9. The apparatus of claim 8, wherein the bonding stage unit further comprises a second suction hole with which the display panel supported on the bonding stage unit is further fixed to the bonding stage unit the second hole in the protrusion.

10. The apparatus of claim 9, wherein location of the head unit above the bonding stage unit disposes the driving circuit non-overlapping with the first suction hole and the second suction hole of the bonding stage unit.

* * * * *